(12) United States Patent
Pidin et al.

(10) Patent No.: US 7,763,509 B2
(45) Date of Patent: Jul. 27, 2010

(54) METHOD OF MANUFACTURING SEMICONDUCTOR DEVICE INCLUDING FORMING TWO STRESS FILMS AND IRRADIATION OF ONE STRESS FILM

(75) Inventors: Sergey Pidin, Kawasaki (JP); Tamotsu Owada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 607 days.

(21) Appl. No.: 11/639,344

(22) Filed: Dec. 15, 2006

(65) Prior Publication Data
US 2008/0124856 A1 May 29, 2008

(30) Foreign Application Priority Data
Aug. 8, 2006 (JP) ............... 2006-215405

(51) Int. Cl.
*H01L 21/8238* (2006.01)
*H01L 21/302* (2006.01)
*H01L 21/461* (2006.01)

(52) U.S. Cl. ...................... 438/199; 438/756

(58) Field of Classification Search ........... 438/199, 438/756; 257/E21.536, E21.04
See application file for complete search history.

(56) References Cited

U.S. PATENT DOCUMENTS

| 7,232,730 B2 * | 6/2007 | Chen et al. ............ 438/301 |
| 2006/0160314 A1 * | 7/2006 | Arghavani ............ 438/285 |
| 2007/0105299 A1 * | 5/2007 | Fang et al. ............ 438/199 |

FOREIGN PATENT DOCUMENTS

JP 2005-057301 A 3/2005

* cited by examiner

*Primary Examiner*—William M. Brewster
(74) *Attorney, Agent, or Firm*—Westerman, Hattori, Daniels & Adrian, LLP (57) ABSTRACT

A method of manufacturing a semiconductor device, in which a stress film having a large stress can be formed with high accuracy over a transistor. The method comprises the steps of: depositing a tensile stress film over the whole surface of a substrate having formed thereon an n-MOSFET; removing by etching the deposited stress film while leaving it on the n-MOSFET; and performing UV irradiation to the remaining stress film. By the UV irradiation, a tensile stress of the stress film is improved. Further, although the stress film is cured by the UV irradiation, occurrence of etching defects caused by the curing is prevented because the UV irradiation is performed after the etching. Thus, speeding-up and high quality of the n-MOSFET can be attained.

4 Claims, 10 Drawing Sheets

METHOD OF MANUFACTURING SEMICONDUCTOR DEVICE INCLUDING FORMING TWO STRESS FILMS AND IRRADIATION OF ONE STRESS FILM

CROSS-REFERENCE TO RELATED APPLICATIONS

This application is based upon and claims the benefits of priority from the prior Japanese Patent Application No. 2006-215405, filed on Aug. 8, 2006, the entire contents of which are incorporated herein by reference.

BACKGROUND OF THE INVENTION

1. Field of the Invention

The present invention relates to a method of manufacturing a semiconductor device. More particularly, the present invention relates to a method of manufacturing a semiconductor device having a transistor including a channel region in which crystals are distorted.

2. Description of the Related Art

One of methods for improving a carrier mobility of a Field Effect Transistor (FET) includes a method for applying a predetermined stress to a channel region of the FET to give a distortion to crystals in the channel region. For example, the following method is proposed. That is, a film (stress film) having a tensile stress or compressive stress as an internal stress is formed on a Metal Oxide Semiconductor Field Effect Transistor (MOSFET) and a predetermined stress is applied to the channel region from the stress film (see, e.g., Japanese Unexamined Patent Publication No. 2005-057301).

A tensile stress applied to a channel region is effective in improving an electron mobility and a compressive stress applied to a channel region is effective in improving a hole mobility, respectively. In a case of a complimentary MOS (CMOS) structure having an n-channel MOSFET (n-MOSFET) and a p-channel MOSFET (p-MOSFET), the following stress films are formed. On the n-MOSFET, a tensile stress film for applying a tensile stress to a channel region of the transistor is formed. On the p-MOSFET, a compressive stress film for applying a compressive stress to a channel region of the transistor is formed.

As such a stress film, a silicon nitride (SiN (including one having an element other than Si and N as the composition)) film is widely used currently.

When forming an SiN stress film on a MOSFET, a method for forming a predetermined stress film over the whole surface and then patterning by etching the formed film to leave the film only on the MOSFET is generally employed.

For example, the following process is performed in a case of the CMOS structure. First, a tensile stress film is formed over the whole surface including an n-MOSFET and a p-MOSFET. Then, the tensile stress film formed on the p-MOSFET is removed by etching so as to be left only on the n-MOSFET.

Also for the p-MOSFET side, the same process is performed. First, a compressive stress film is formed over the whole surface after forming the tensile stress film on the n-MOSFET. Then, the compressive stress film formed on the n-MOSFET side is removed by etching so as to be left only on the p-MOSFET.

Through the above-described process, the following CMOS structure is obtained. That is, the tensile stress film is formed on the n-MOSFET and the compressive stress film is formed on the p-MOSFET. In other words, the tensile stress film and the compressive stress film are split and stuck on the n-MOSFET and the p-MOSFET, respectively. In addition, there may be employed a method for firstly forming the compressive stress film and then forming the tensile stress film. Also in this case, there can be obtained the CMOS structure in which the tensile stress film and the compressive stress film are thus split and stuck through the same sequence.

Recently, there is used a method for irradiating Ultraviolet (UV) to a stress film and modifying the stress film properties to thereby control a stress of the film. When being irradiated with UV, the tensile stress film increases in tensile stress. Further, the tensile stress film irradiated with UV is liable to cure.

In a case where such UV irradiation to the tensile stress film is applied to the above-described splitting and sticking process in the CMOS structure, when the tensile stress film is formed over the whole surface and UV irradiation is subsequently performed to the tensile stress film, the following conditions may occur. That is, the tensile stress larger than that before the UV irradiation can be obtained. On the other hand, however, the tensile stress film is cured by the UV irradiation and therefore, subsequent etching (removal from the p-MOSFET side of the tensile stress film after the UV irradiation) becomes difficult.

More specifically, after UV irradiation to the tensile stress film, high-accurate etching cannot be performed under conventional etching conditions (in the case of performing no UV irradiation). Further, when the etching conditions are made more severe, over-etching to a foundation layer is more likely to occur.

Such an etching problem which occurs in the UV-irradiated tensile stress film may similarly occur in the following case. That is a case where not only in the above-described splitting and sticking process of the CMOS structure but also in a forming process of a device having the n-MOSFET, the UV-irradiated tensile stress film is selectively removed by etching.

Further, the same problem may also occur in the following case. That is a case where regardless of the tensile stress film or the compressive stress film, UV irradiation is performed to the stress film for the purpose of modification of the film and then the film is selectively removed by etching.

Thus, in the case of using the UV-irradiated stress film, when the traditional method is used, securement of high reliability as well as speeding up of transistors by the stress film is difficult.

SUMMARY OF THE INVENTION

In view of the foregoing, it is an object of the present invention to provide a method for manufacturing a high-performance and high-quality semiconductor device using a stress film.

To accomplish the above object, according to one aspect of the present invention, there is provided a method for manufacturing a semiconductor device, comprising the steps of: forming a stress film on a substrate having formed thereon a transistor; removing the formed stress film while leaving it on the transistor; and irradiating ultraviolet rays to the stress film which remains on the transistor.

According to another aspect of the present invention, there is provided a method for manufacturing a semiconductor device, comprising the steps of: forming one stress film on a substrate having formed thereon one transistor and another transistor; removing the formed one stress film while leaving it on the one transistor; forming another stress film on the substrate where the one stress film remains; removing the formed another stress film while leaving it on the another transistor; and irradiating ultraviolet rays to the one stress film which remains on the one transistor and to the another stress film which remains on the another transistor.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

By taking as an example a splitting and sticking process of a stress film in a CMOS structure, preferred embodiments of the present invention will be described in detail below with reference to the accompanying drawings.

First, a first embodiment will be described.

Figure 1:
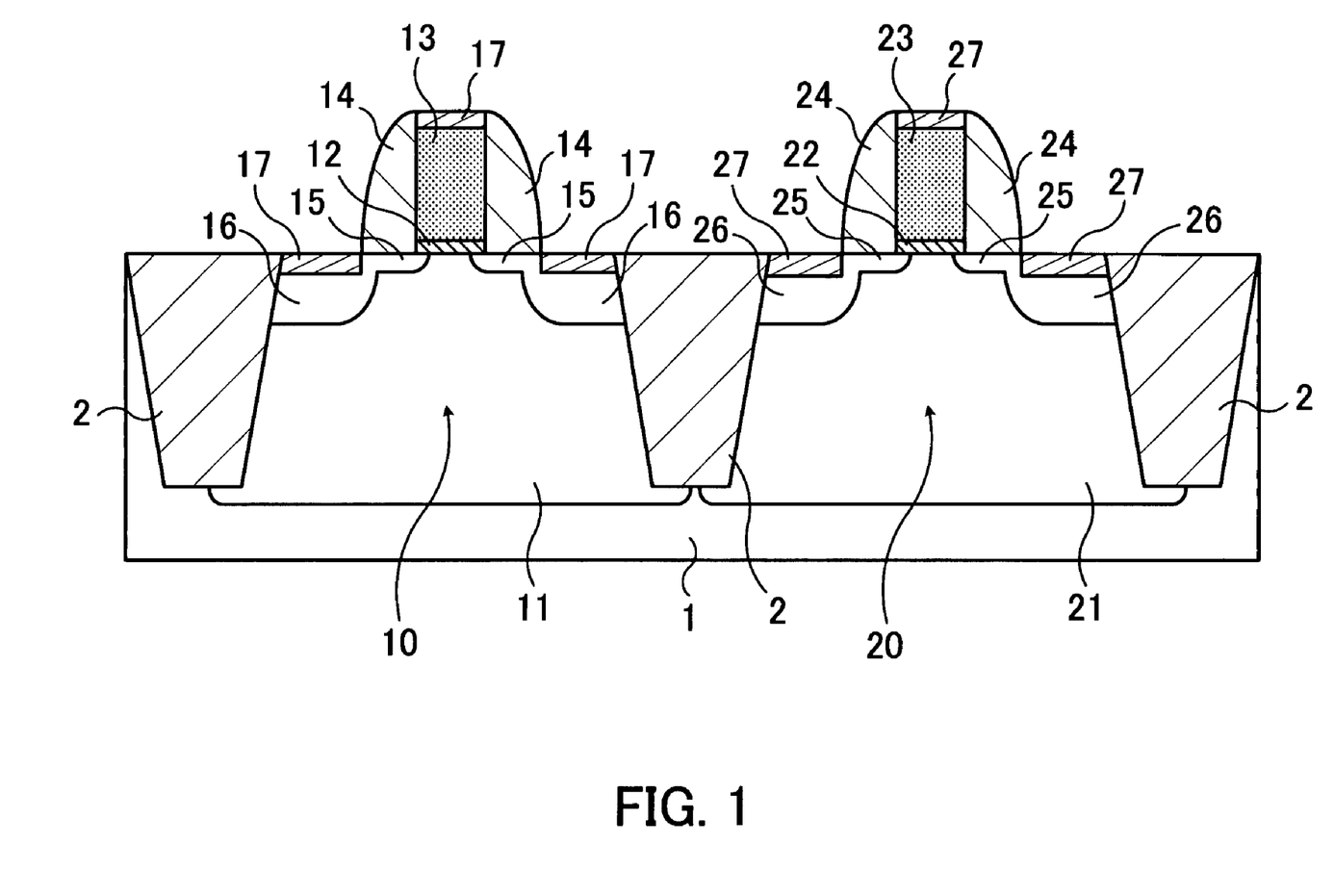
FIG. 1 is a schematic cross-sectional view of an essential part of a MOSFET formation step.

FIG. 1 is a schematic cross-sectional view of an essential part of a MOSFET formation step.

A basic CMOS structure having an n-MOSFET 10 and a p-MOSFET 20 as shown in FIG. 1 is first formed according to a normal process. The CMOS structure is, formed, for example, using a p-type Si substrate 1. The n-MOSFET 10 and the p-MOSFET 20 are subjected to element isolation by a Shallow Trench Isolation (STI) 2.

The n-MOSFET 10 is formed as follows. Within the Si substrate 1 for forming the n-MOSFET 10, a p-type well region 11 is formed, for example, using a p-type impurity such as boron (B). On such an Si substrate 1, a gate electrode 13 made of polysilicon is formed through a gate insulating film 12 made of silicon oxide ($SiO_2$). On side walls of the gate insulating film 12 and the gate electrode 13, a sidewall 14 made of $SiO_2$ is formed. Within the Si substrate 1 on both sides of the gate electrode 13, a source drain extension region 15 and a source drain region 16 are formed using an n-type impurity such as phosphorus (P) or arsenic (As). On a surface layer of the gate electrode 13 as well as on a surface layer of the source drain region 16, silicide layers 17 are formed. No well region 11 may be formed within the Si substrate 1 of the n-MOSFET 10.

The p-MOSFET 20 is formed as follows. Within the Si substrate 1 for forming the p-MOSFET 20, an n-type well region 21 is formed, for example, using P or As. On such an Si substrate 1, a gate electrode 23 made of polysilicon is formed through a gate insulating film 22 made of silicon oxide ($SiO_2$). On side walls of the gate insulating film 22 and the gate electrode 23, a sidewall 24 made of $SiO_2$ is formed. Within the Si substrate 1 on both sides of the gate electrode 23, a source drain extension region 25 and a source drain region 26 are formed using a p-type impurity such as B. On a surface layer of the gate electrode 23 as well as on a surface layer of the source drain region 26, silicide layers 27 are formed.

The CMOS structure (substrate) including the n-MOSFET 10 and p-MOSFET 20 each having the above-described structure is formed according to a normal process. Herein, a film thickness and impurity concentration of each portion in this CMOS structure are arbitrarily set in response to demand characteristics of the CMOS structure. By way of example, the gate electrodes 13 and 23 are each formed to a gate length of about 30 to 40 nm and a gate height of about 100 nm. The sidewalls 14 and 24 are each formed to a width of about 50 nm.

Figure 2:
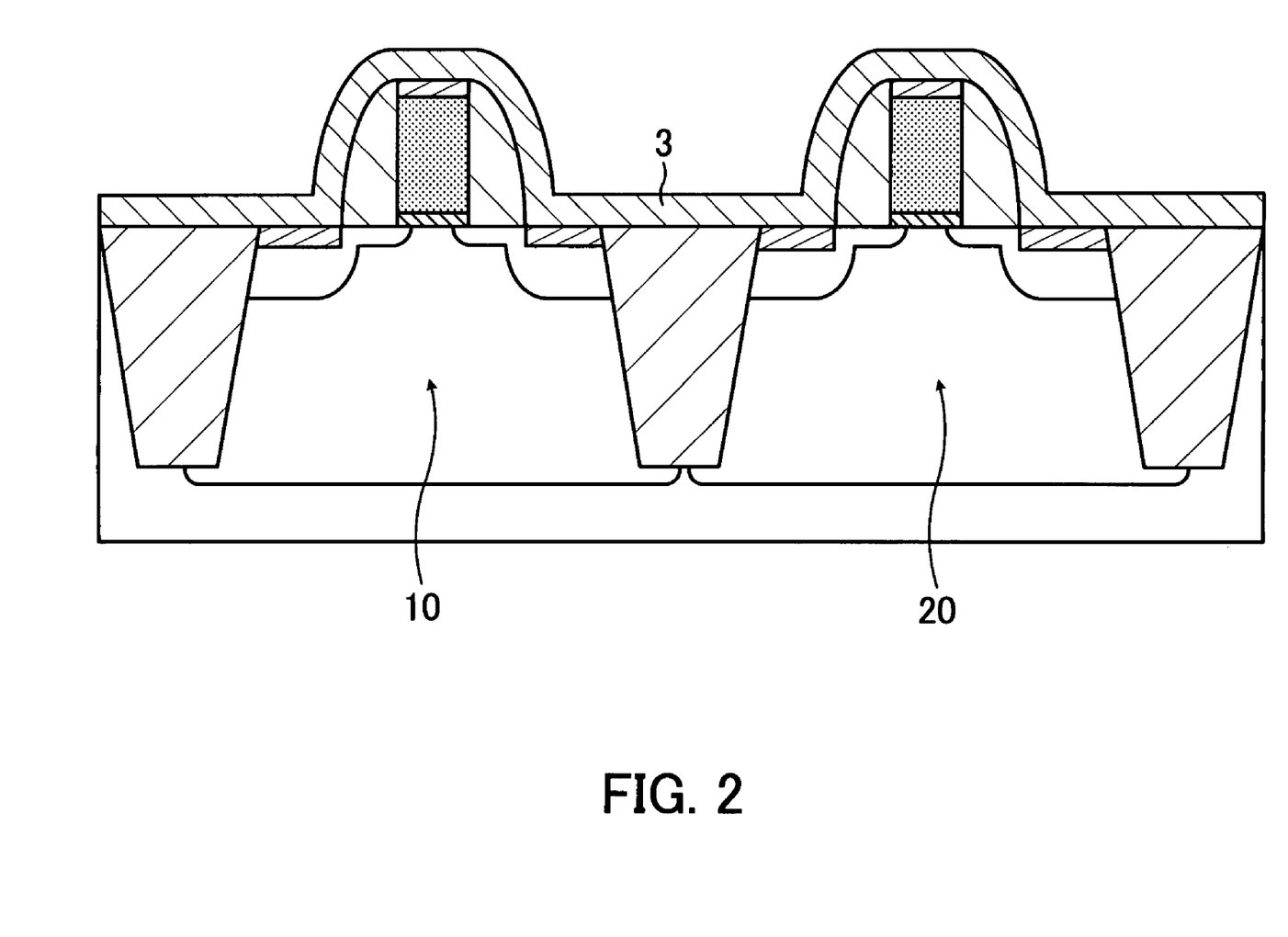
FIG. 2 is a schematic cross-sectional view of an essential part of a tensile stress film deposition step.

FIG. 2 is a schematic cross-sectional view of an essential part of a tensile stress film deposition step.

After formation of the n-MOSFET 10 and the p-MOSFET 20, a tensile stress film 3 made of SiN and having a film thickness of about 70 nm is deposited over the whole surface of the substrate.

The tensile stress film 3 is deposited, for example, using a Chemical Vapor Deposition (CVD) method. In the method, silane gas ($SiH_2Cl_2$, $SiH_4$, $Si_2H_4$, $Si_2H_6$) is used as an Si material and ammonia ($NH_3$) gas is used as an N material.

During the deposition, a flow rate of the silane gas is set in the range of 5 to 50 sccm and a flow rate of the $NH_3$ gas is set in the range of 500 to 10000 sccm. Further, nitrogen gas ($N_2$) or argon (Ar) gas is used as a carrier gas and a flow rate thereof is set in the range of 500 to 10000 sccm.

A chamber for introducing each gas is controlled to have an inner pressure of 0.1 to 400 Torr and a temperature of 400° C. to 450° C.

Herein, the flow rate unit sccm is a reduced value of the flow rate mL/min at 0° C. and 101.3 kPa. 1 Torr is about 133.322 Pa.

The tensile stress film 3 deposited under such conditions has a tensile stress of about 400 to 500 MPa. In the formed tensile stress film 3, hydrogen (H) usually remains.

Herein, after the deposition of the tensile stress film 3 over the whole surface of the substrate, the process proceeds to the next step without performing the UV irradiation to the film 3.

Figure 3:
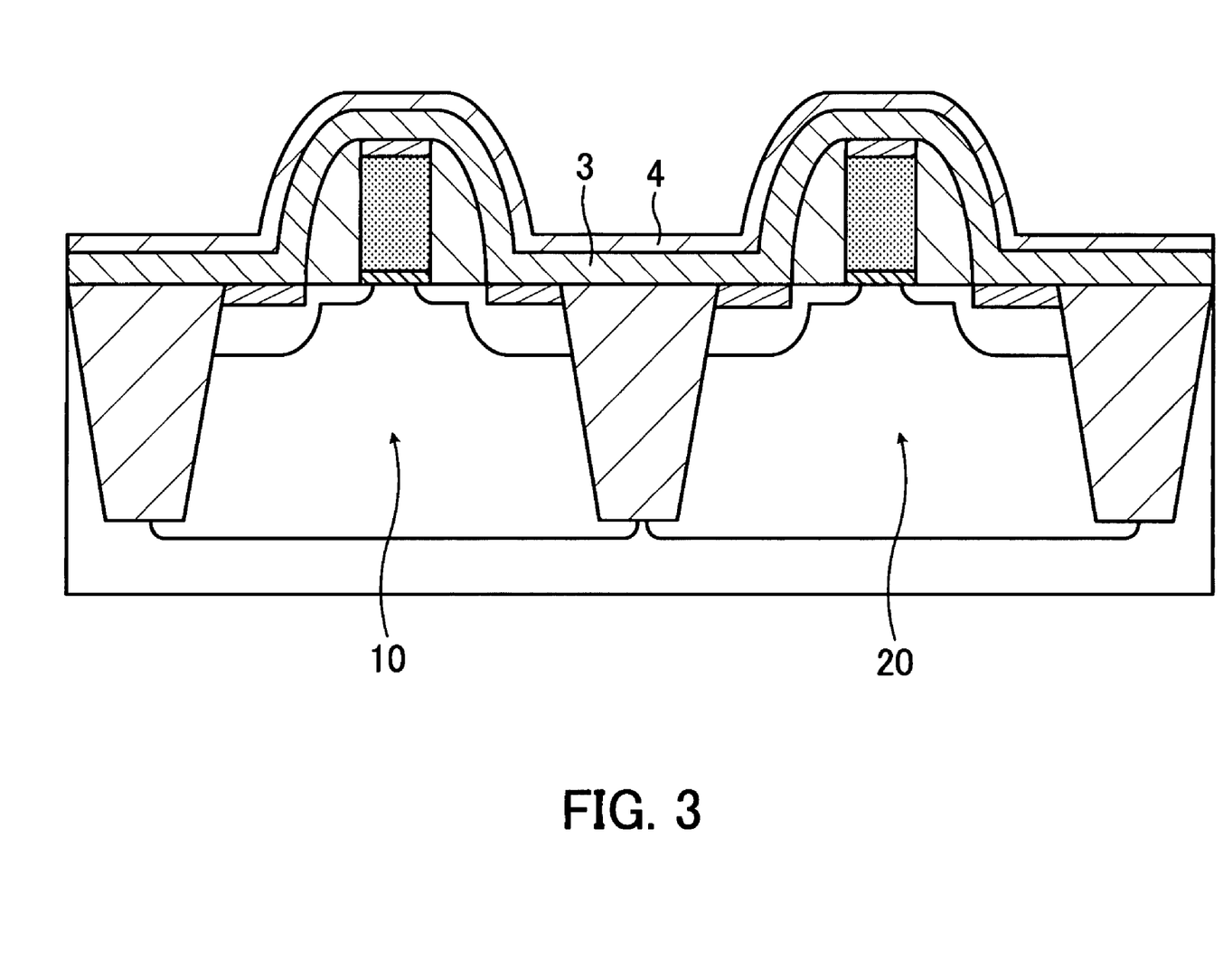
FIG. 3 is a schematic cross-sectional view of an essential part of an oxide film deposition step.

FIG. 3 is a schematic cross-sectional view of an essential part of an oxide film deposition step.

After depositing the tensile stress film 3 over the whole surface of the substrate, a $SiO_2$ film 4 is deposited on the film 3.

The $SiO_2$ film 4 is deposited to a film thickness of about 25 nm, for example, using a plasma CVD method. On this occasion, for example, a mixed gas composed of $SiH_4$ and oxygen ($O_2$) is used and a substrate temperature is set to about 400° C.

Figure 8:
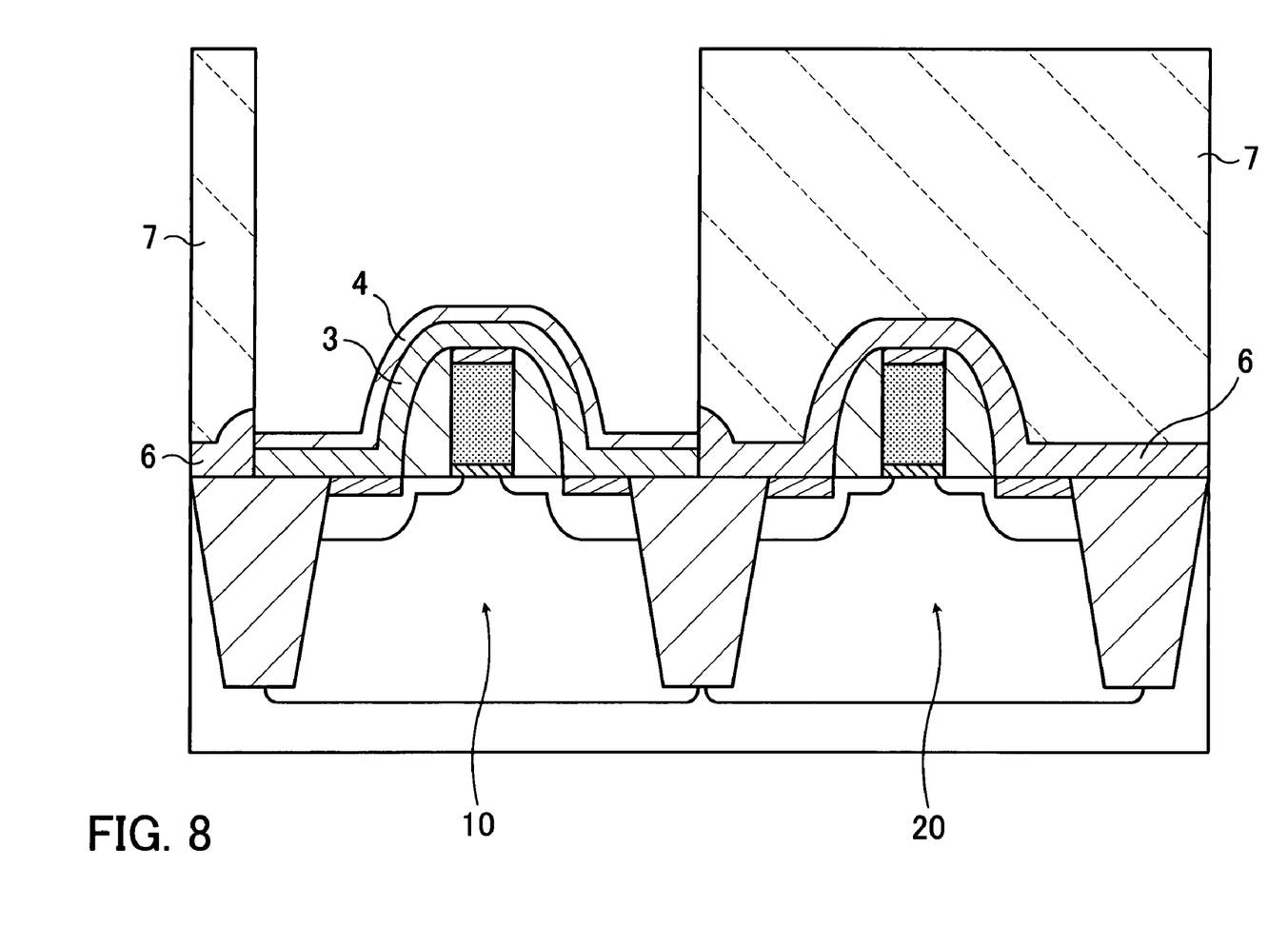
FIG. 8 is a schematic cross-sectional view of an essential part of a compressive stress film etching step.

The $SiO_2$ film 4 herein formed functions as an etching stopper in etching the after-mentioned compressive stress film 6 (see FIG. 8).

Figure 4:
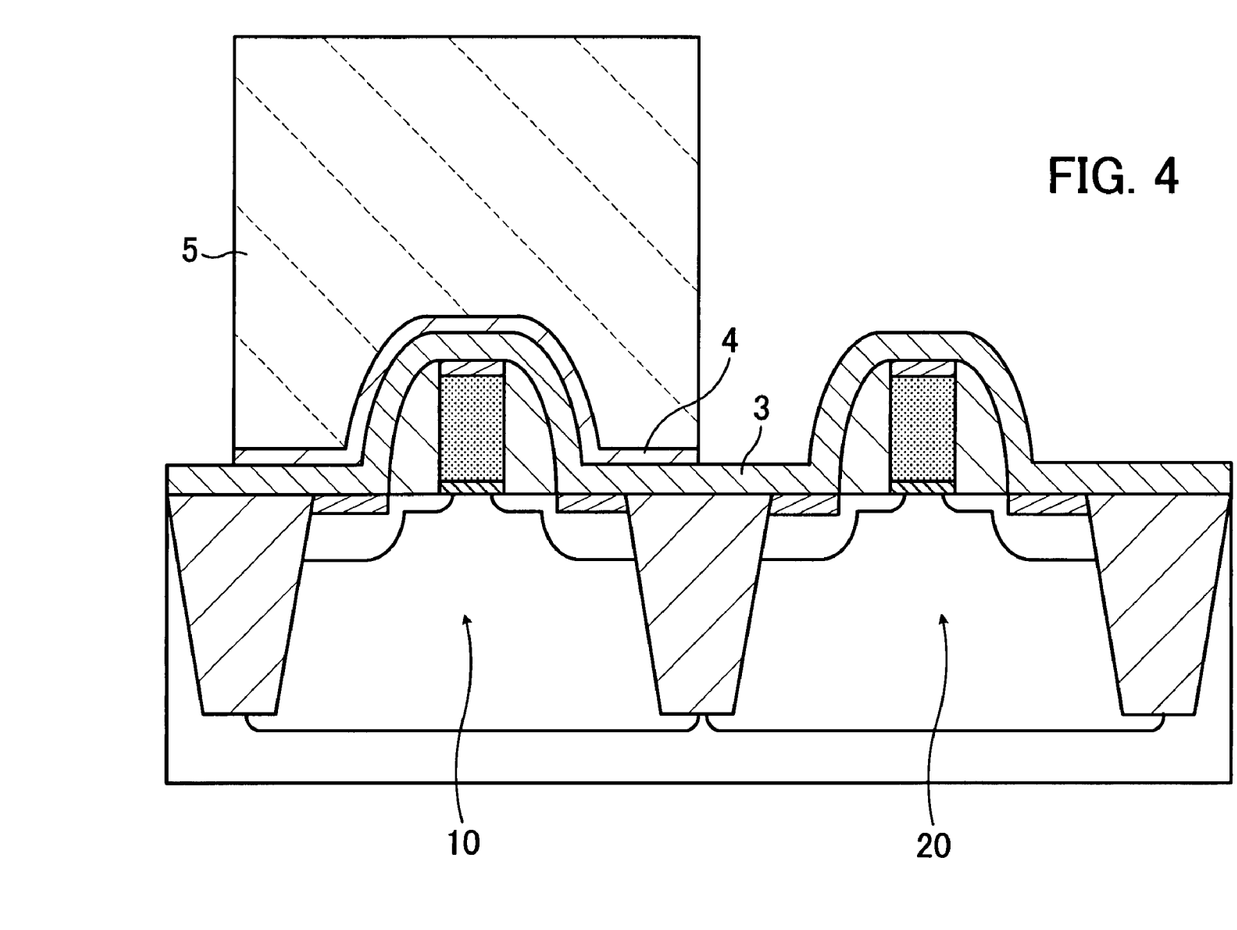
FIG. 4 is a schematic cross-sectional view of an essential part of an oxide film etching step.

FIG. 4 is a schematic cross-sectional view of an essential part of an oxide film etching step.

After the deposition of the $SiO_2$ film 4, a resist mask 5 is formed on the n-MOSFET 10 side and the $SiO_2$ film 4 deposited on the p-MOSFET 20 side is removed by etching. The etching of the $SiO_2$ film 4 is performed, for example, by a Reactive Ion Etching (RIE) method using a $C_4F_8/Ar/O_2$ gas.

Figure 5:
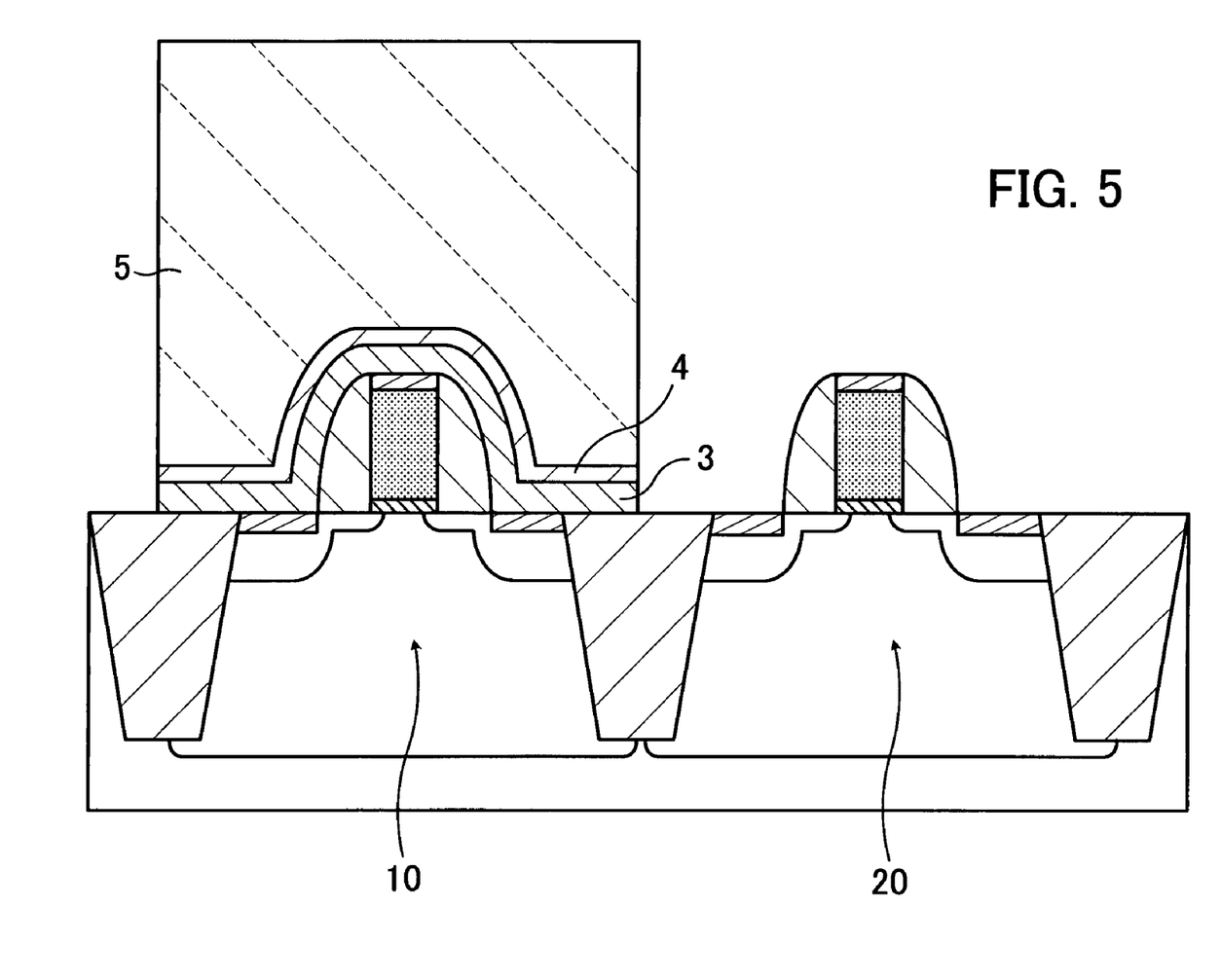
FIG. 5 is a schematic cross-sectional view of an essential part of a tensile stress film etching step.

FIG. 5 is a schematic cross-sectional view of an essential part of a tensile stress film etching step.

After the etching of the $SiO_2$ film 4, the tensile stress film 3 deposited on the p-MOSFET 20 side is removed by etching using the same resist mask 5. The etching of the film 3 is performed, for example, by the RIE method using a $CHF_3/Ar/O_2$ gas.

After the etching of the tensile stress film 3 on the p-MOSFET 20 side, the resist mask 5 is removed.

Through the etching of the $SiO_2$ film 4 shown in FIG. 4 as well as the etching of the tensile stress film 3 shown in FIG. 5, the tensile stress film 3 and the $SiO_2$ film 4 are left only on the n-MOSFET 10. To a channel region of the n-MOSFET 10, a tensile stress is applied by this tensile stress film 3.

Figure 6:
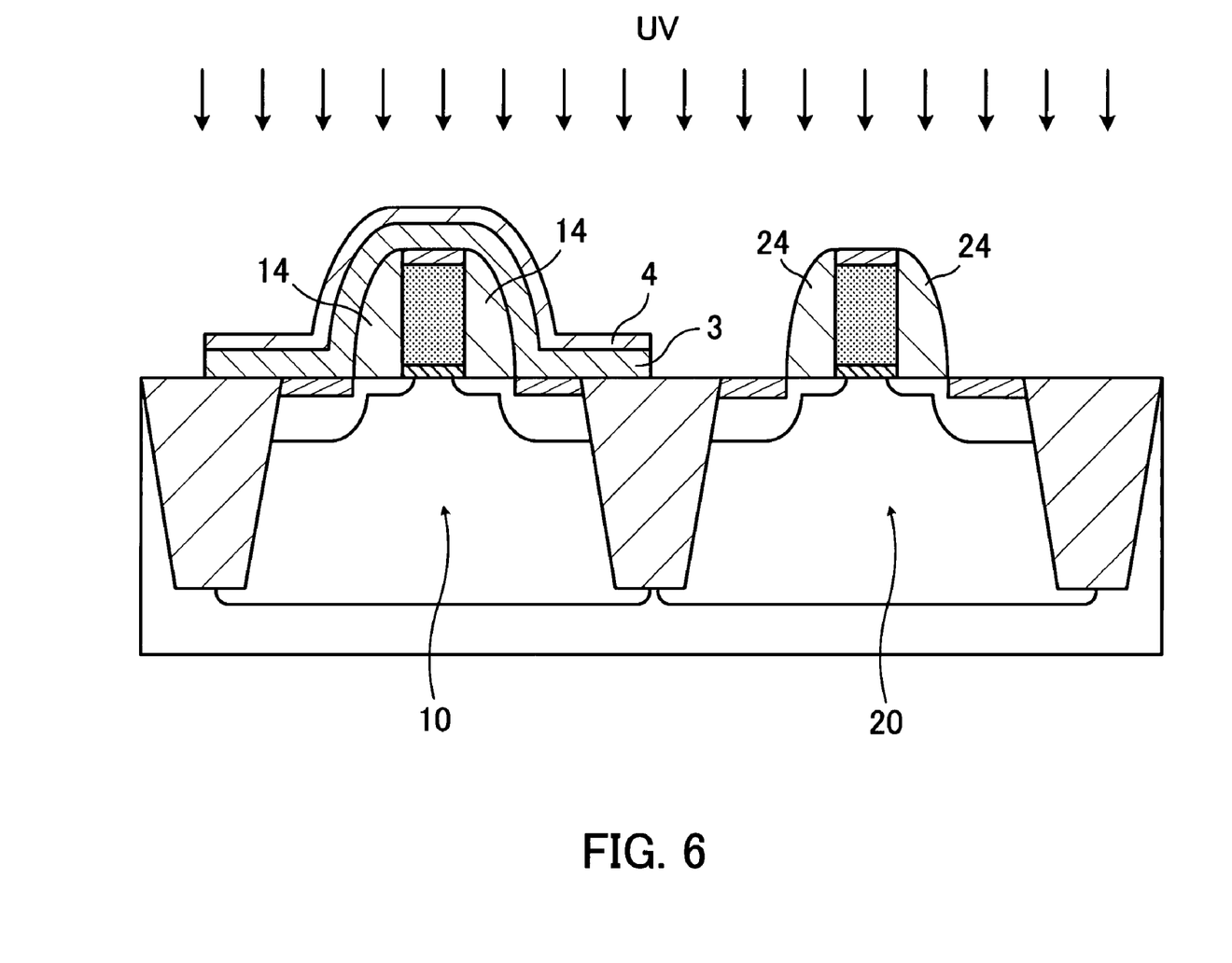
FIG. 6 is a schematic cross-sectional view of an essential part of a UV irradiation step.

FIG. 6 is a schematic cross-sectional view of an essential part of a UV irradiation step.

After the removal of the resist mask 5 shown in FIG. 5, UV irradiation is performed to the tensile stress film 3 which remains on the n-MOSFET 10. Using a UV irradiation apparatus capable of performing the UV irradiation while controlling a chamber inside to a predetermined environment, the UV irradiation is performed, for example, under conditions where the irradiation temperature is about 450° C. and the irradiation time is about 20 minutes.

The irradiated UV transmits the thin $SiO_2$ film 4 to reach the tensile stress film 3 under the film 4. The tensile stress film 3 irradiated with UV is increased in the tensile stress as well as is cured as compared with that before the UV irradiation. This results from the fact that hydrogen which remains in the tensile stress film 3 is removed by the UV irradiation.

By this UV irradiation, the tensile stress which is about from 400 to 500 MPa before the UV irradiation can be improved to about 2 GPa.

In order to improve a tensile stress, the UV irradiation to the tensile stress film 3 may be performed over the whole surface of the film 3 after the deposition of the film 3 over the whole surface of the substrate shown in FIG. 2.

In this case, however, the tensile stress film 3 is cured with the improvement of the tensile stress. Therefore, when subsequently removing by etching the film 3 from the p-MOSFET 20 surface (see FIG. 5), it becomes difficult to remove the film 3 with high accuracy as well as with no damage to a foundation layer of the film 3.

Accordingly, by performing the UV irradiation after the etching of the film 3 as shown in FIG. 6, the removal by etching of the film 3 is made easy and at the same time, an improvement of the tensile stress can be attained.

In the case of performing UV irradiation over the whole surface of the tensile stress film 3 after the deposition of the film 3 shown in FIG. 2, the UV irradiation is performed, for example, under conditions where the irradiation temperature is about 450° C. and the irradiation time is about 25 minutes. In other words, in order to obtain a constant improvement effect of the tensile stress, since the film 3 is formed over the whole surface of the substrate, UV irradiation for a longer time is required.

On the contrary, when performing UV irradiation after the etching of the tensile stress film 3 as shown in FIG. 6, since the film 3 is formed only on the n-MOSFET 10, UV irradiation for a shorter time is enough.

In the UV irradiation step shown in FIG. 6, UV is irradiated not only to the tensile stress film 3 which remains on the n-MOSFET 10 but also to the p-MOSFET 20 which is exposed by the removal of the film 3 in the step shown in FIG. 5. However, no characteristic deterioration of the p-MOSFET 20 due to this UV irradiation is recognized. Accordingly, by performing the UV irradiation, an improvement in the tensile stress of the film 3 which remains on the n-MOSFET 10 can be attained without exerting any influence on the p-MOSFET 20.

A sidewall of a MOSFET is generally formed using $SiO_2$ or SiN. In the n-MOSFET 10 and the p-MOSFET 20, the sidewalls 14 and 24 are preferably formed using $SiO_2$ as described above. The reason is that in the UV irradiation step shown in FIG. 6, UV is irradiated not only to the tensile stress film 3 on the n-MOSFET 10 but also to the sidewall 14 of the n-MOSFET 10 or to the sidewall 24 of the p-MOSFET 20.

In other words, when the sidewalls 14 and 24 are formed using SiN, a tensile stress may occur on the sidewalls due to the UV irradiation, depending on the composition of the sidewalls. When the tensile stress occurs on the sidewall 14 of the n-MOSFET 10, the tensile stress is applied to a channel region of the n-MOSFET 10 from the tensile stress film 3 as well as from the sidewall 14.

On the other hand, when the tensile stress occurs on the sidewall 24 of the p-MOSFET 20, the tensile stress is applied to a channel region of the p-MOSFET 20. Therefore, even when the compressive stress film 6 is formed on the p-MOSFET 20 as described later, an effect of the film 6 is reduced.

It is also technically possible to form the sidewall 14 using SiN and to form the sidewall 24 using $SiO_2$. However, considering that the tensile stress of the UV-irradiated tensile stress film 3 sufficiently increases, there is no need to form the sidewalls 14 and 24 using different materials. Therefore, it is simple and effective to form both of the sidewalls 14 and 24 using $SiO_2$.

Figure 7:
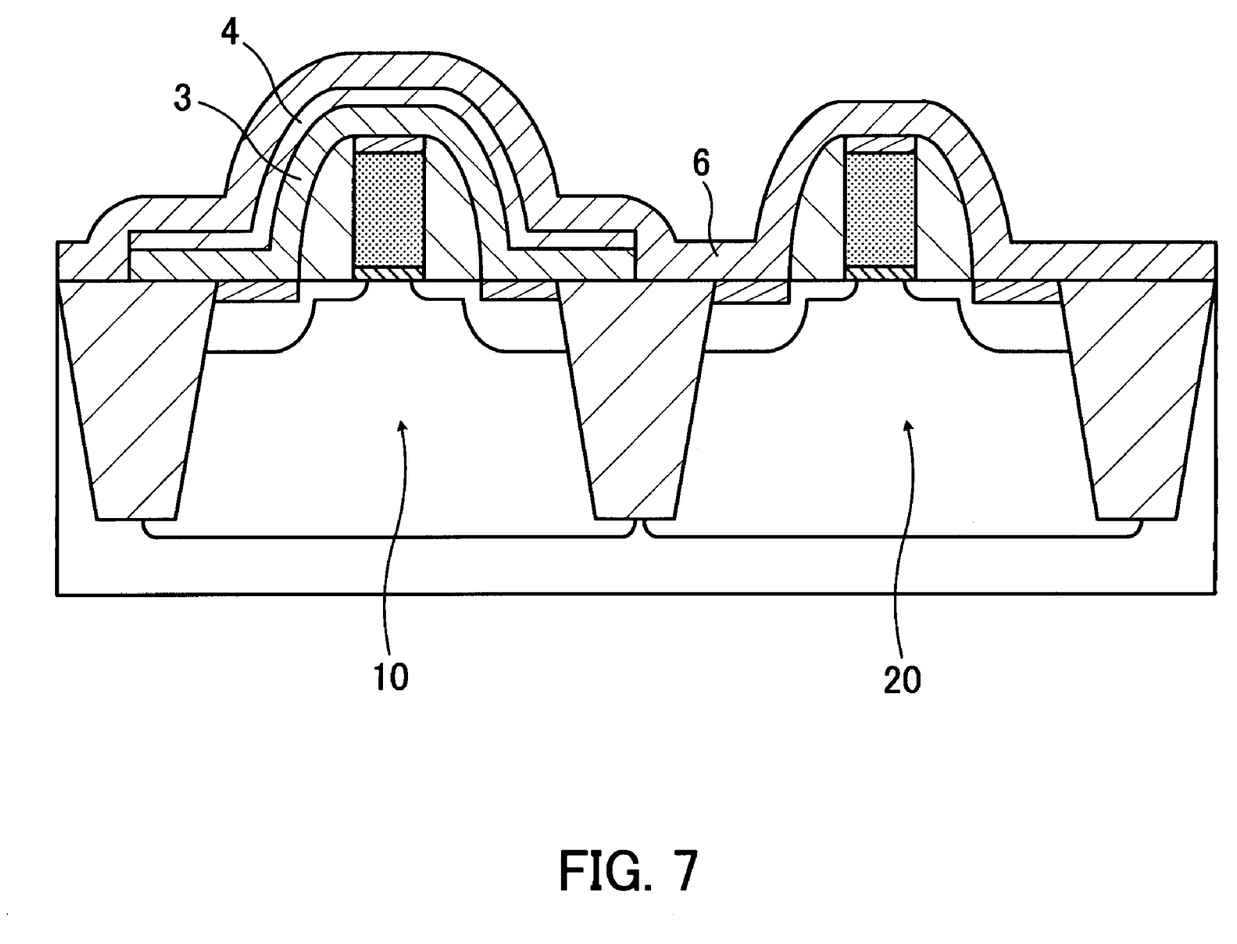
FIG. 7 is a schematic cross-sectional view of an essential part of a compressive stress film deposition step.

FIG. 7 is a schematic cross-sectional view of an essential part of a compressive stress film deposition step.

After the UV irradiation to the tensile stress film 3 on the n-MOSFET 10, the compressive stress film 6 made of SiN and having a film thickness of about 70 nm is deposited over the whole surface of the substrate where the film 3 and the $SiO_2$ film 4 remain.

The compressive stress film 6 is deposited, for example, using the CVD method. In the method, $SiH_4$ gas is used as an Si material and $NH_3$ gas is used as an N material.

During the deposition, a flow rate of the $SiH_4$ gas is set in the range of 100 to 1000 sccm and a flow rate of the $NH_3$ gas is set in the range of 500 to 10000 sccm. Further, nitrogen ($N_2$) gas or argon (Ar) gas is used as a carrier gas and the flow rate thereof is set in the range of 500 to 10000 sccm. A chamber for introducing each gas is controlled to have an inner pressure of 0.1 to 400 Torr and a temperature of 400 to 450° C. RF power is about 100 to 1000 W.

The compressive stress film 6 deposited under such conditions has a compressive stress of about 3 GPa.

FIG. 8 is a schematic cross-sectional view of an essential part of a compressive stress film etching step.

After depositing the compressive stress film 6 over the whole surface, a resist mask 7 is formed on the p-MOSFET 20 side. Using the $SiO_2$ film 4 as an etching stopper, the compressive stress film 6 deposited on the n-MOSFET 10 side is removed by etching. The etching of the compressive stress film 6 is performed, for example, by the RIE method using a $CHF_3/Ar/O_2$ gas.

After the etching of the compressive stress film 6 on the n-MOSFET 10 side, the resist mask 7 is removed.

Figure 9:
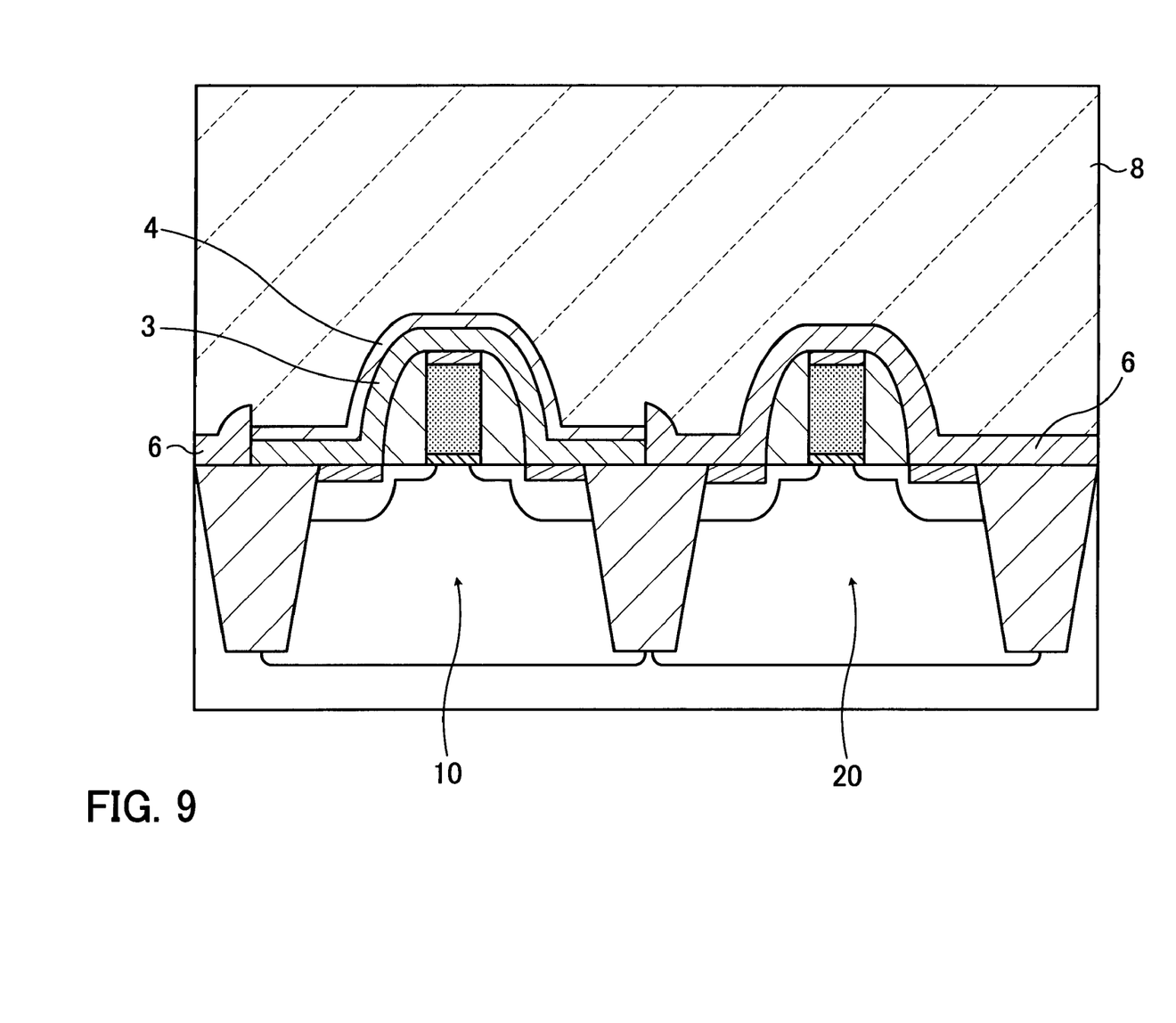
FIG. 9 is a schematic cross-sectional view of an essential part of an interlayer insulating film deposition step.

FIG. 9 is a schematic cross-sectional view of an essential part of an interlayer insulating film deposition step.

After removing the resist mask 7, a TEOS oxide film 8 as an interlayer insulating film is deposited over the whole surface. Using tetra-ethoxysilane (TEOS, $Si(OC_2H_5OH)_4$) as a raw material, the TEOS oxide film 8 is deposited using the plasma CVD method. The TEOS oxide film 8 is first deposited over the whole surface to a film thickness of about 600 nm. Then, the film 8 is flattened using a Chemical Mechanical Polishing (CMP) method and finally reduced to a film thickness of about 350 nm.

Through the steps so far, there is completed the CMOS structure in which the tensile stress film 3 and the compressive stress film 6 are split and stuck on the n-MOSFET 10 and the p-MOSFET 20, respectively. Thereafter, a contact electrode and a wiring layer are formed according to a normal process. Thus, a device having the CMOS structure is completed.

As described above, in the first embodiment, the tensile stress film 3 is formed over the whole surface. Then, the film 3 is removed by etching from the p-MOSFET 20 surface while being left on the n-MOSFET 10. Further, UV irradiation is performed to the remaining film 3. Thereafter, the compressive stress film 6 is formed on the p-MOSFET 20.

Therefore, the etching of the tensile stress film 3 is performed with ease and with high accuracy as well as the tensile stress film 3 having a large tensile stress can be formed on the n-MOSFET 10. Accordingly, there can be realized a high-performance and high-quality CMOS device in which a large tensile stress is applied to the channel region of the n-MOSFET 10 and a large compressive stress is applied to the channel region of the p-MOSFET 20.

The UV irradiation to the tensile stress film 3 removes hydrogen which remains in the film as described above. Accompanying with the removal, a tensile stress of the film 3 is improved and as a result, an improvement in an electron mobility in the n-MOSFET 10 is attained. Further, by the removal of hydrogen from the tensile stress film 3, Negative Bias Temperature Instability (NBTI) in the CMOS device may be suppressed.

Next, a second embodiment will be described.

In the second embodiment, the same elements as those shown in the first embodiment are indicated by the same reference numerals as in the first embodiment and the detailed description is omitted.

The second embodiment differs from the first embodiment in the following point. In the second embodiment, the tensile stress film 3 and the compressive stress film 6 are formed on the n-MOSFET 10 and the p-MOSFET 20, respectively. Then, UV irradiation is collectively performed to both of the tensile stress film 3 and the compressive stress film 6.

More specifically, deposition of the tensile stress film 3 shown in FIG. 2, formation and etching of the $SiO_2$ film 4 shown in FIGS. 3 and 4, and etching of the tensile stress film 3 shown in FIG. 5 are performed on the CMOS structure shown in FIG. 1. Then, without performing the UV irradiation, the process proceeds to the deposition step of the compressive stress film 6 shown in FIG. 7. Further, the film 6 on the film 4 is removed by etching and then, a resist mask 7 is removed as shown in FIG. 8. In the second embodiment, when the patterning of the films 3 and 6 is thus completed, UV irradiation is performed to the films 3 and 6.

Figure 10:
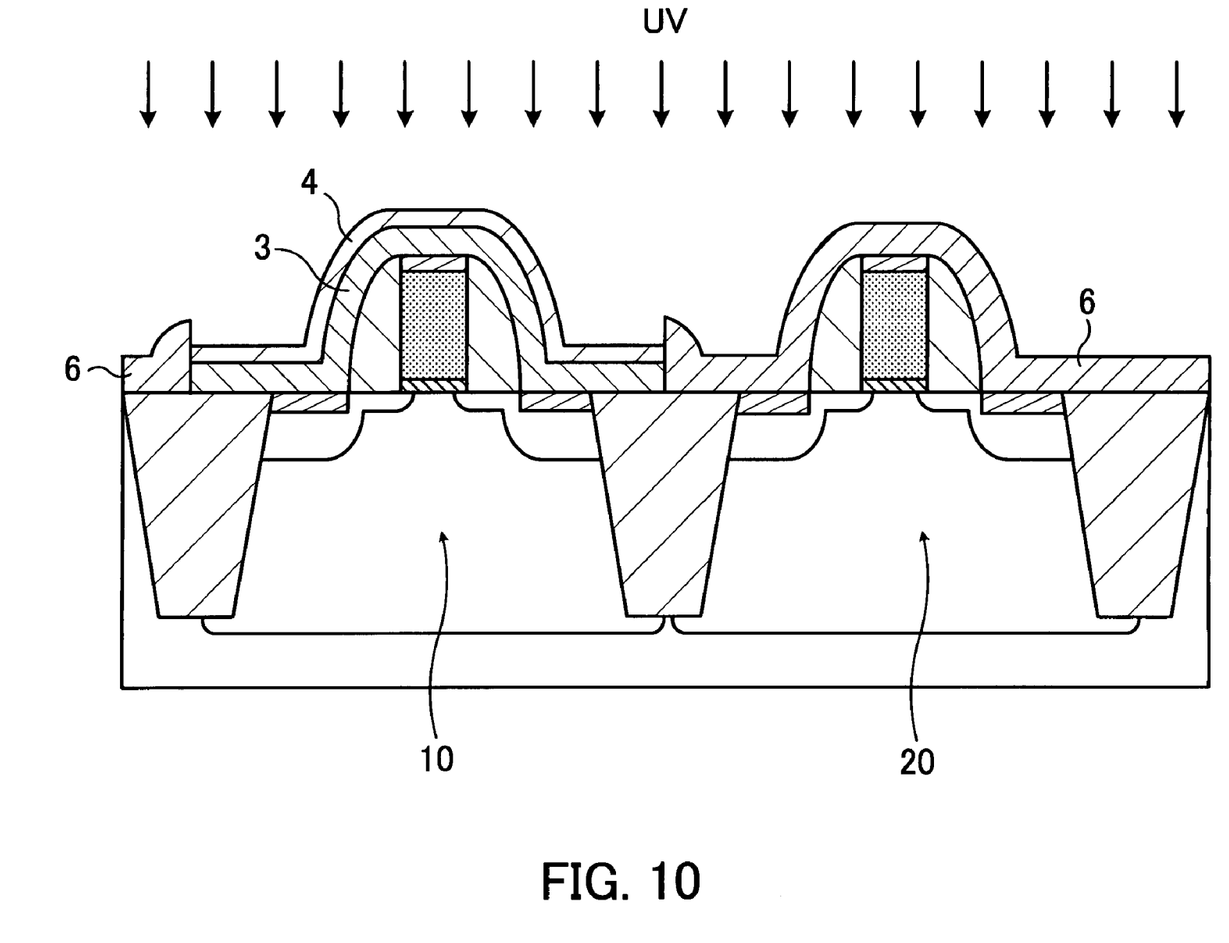
FIG. 10 is a schematic cross-sectional view of an essential part of a UV irradiation step to a tensile stress film and a compressive stress film.

FIG. 10 is a schematic cross-sectional view of an essential part of a UV irradiation step to a tensile stress film and a compressive stress film.

When removing the resist mask 7 after the etching of the compressive stress film 6 shown in FIG. 8, a state as shown in FIG. 10 is obtained. That is, the tensile stress film 3 before the UV irradiation is formed on the n-MOSFET 10 and the compressive stress film 6 before the UV irradiation is formed on the p-MOSFET 20.

Then, UV irradiation is collectively performed to both of the tensile stress film 3 and the compressive stress film 6. Using a UV irradiation apparatus capable of performing UV irradiation while controlling a chamber inside to a predetermined environment, the UV irradiation is performed for example, under conditions where the irradiation temperature is about 450° C. and the irradiation time is about 20 minutes. By this UV irradiation, the tensile stress in the film 3, which is about from 400 to 500 MPa before the UV irradiation, can be improved to about 2 GPa.

During the UV irradiation, UV is irradiated to the tensile stress film 3 as well as to the compressive stress film 6. The UV irradiation to the compressive stress film 6 leads to reduction in the compressive stress. However, when depositing the film 6 under the above-described conditions (see the description of FIG. 7), the amount of reduction in the compressive stress due to UV irradiation can be suppressed to 200 MPa or less (the compressive stress in the film 6 before the UV irradiation is about 3 GPa).

After the UV irradiation shown in FIG. 10, the TEOS oxide film 8 having a predetermined film thickness is formed as shown in FIG. 9. Thus, there is completed the CMOS structure in which the tensile stress film 3 and the compressive stress film 6 are split and stuck on the n-MOSFET 10 and the p-MOSFET 20, respectively. Thereafter, a contact electrode and a wiring layer are formed according to a normal process. Thus, a device having the CMOS structure is completed.

In this second embodiment, the tensile stress film 3 is first deposited over the whole surface. Then, the film 3 deposited on the p-MOSFET 20 side is removed by etching so as to be left on the n-MOSFET 10. Thereafter, the compressive stress film 6 is deposited over the whole surface. Then, the film 6 deposited on the n-MOSFET 10 side is removed by etching so as to be left on the p-MOSFET 20.

A deposition order of the tensile stress film 3 and the compressive stress film 6 may be reversed. More specifically, the compressive stress film 6 is first deposited over the whole surface. Then, the film 6 deposited on the n-MOSFET 10 side is removed by etching so as to be left on the p-MOSFET 20. Thereafter, the tensile stress film 3 is deposited over the whole surface. Then, the film 3 deposited on the p-MOSFET 20 side is removed by etching so as to be left on the n-MOSFET 10.

Also in this case, after completion of the etching to remove from the p-MOSFET 20 side the tensile stress film 3 deposited over the whole surface and to leave the film 3 on the n-MOSFET 10 surface, UV irradiation under the predetermined conditions may be collectively performed to the tensile stress film 3 and the compressive stress film 6.

As described above, in the second embodiment, after completion of the etching of the tensile stress film 3 and compressive stress film 6 deposited under the predetermined conditions, the UV irradiation is collectively performed to the films 3 and 6.

Therefore, the etching of the tensile stress film 3 is performed with ease and with high accuracy as well as the tensile stress film 3 having a large tensile stress can be formed on the n-MOSFET 10. Further, the tensile stress of the compressive stress film 6 is kept large even after the UV irradiation. Accordingly, there can be realized a high-performance and high-quality CMOS device in which a large tensile stress is applied to the channel region of the n-MOSFET 10 and a large compressive stress is applied to the channel region of the p-MOSFET 20.

The collective UV irradiation to the tensile stress film 3 and the compressive stress film 6 removes hydrogen which remains in the films 3 and 6, as described above. When hydrogen is removed from the films 3 and 6, the NBTI in the CMOS device may be suppressed.

In the above description, the splitting and sticking process of the tensile stress film and the compressive stress film in the CMOS structure is described by way of example. The above-described method for performing the UV irradiation to the tensile stress film after completion of the etching can be similarly applied to a forming process of the CMOS device as well as of various devices having an n-MOSFET.

More specifically, there may be employed a method for depositing over the whole surface of the substrate having formed thereon the n-MOSFET the tensile stress film having the tensile stress, removing by etching the film while leaving it on the n-MOSFET, and performing UV irradiation to the tensile stress film which remains on the n-MOSFET.

In the above description, the tensile stress film having a certain level of tensile stress is previously deposited on the n-MOSFET. Then, UV irradiation is performed to the tensile stress film to increase the tensile stress of the film. In addition, there may be employed, for example, a method for depositing the compressive stress film having a certain level of compressive stress and performing UV irradiation to the film to produce the compressive stress.

Also to a case of performing the UV irradiation to the compressive stress film for the purpose of modification and NBTI suppression, the above-described method for performing the UV irradiation after the etching can be applied.

In the present invention, the stress film is formed on the substrate having formed thereon a transistor, the stress film is removed while being left on the transistor and then, UV irradiation is performed to the remaining stress film. Therefore, removal of the stress film can be performed with high accuracy. As a result, there can be realized the high-performance and high-quality semiconductor device having a transistor in which the carrier mobility is improved by the stress film.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
   forming a first transistor including a first gate electrode, a first drain electrode and a first source electrode on a substrate;
   forming a second transistor including a second electrode, a second drain electrode and a second source electrode on the substrate;
   forming a first stress film over the substrate and over the first gate electrode, the first drain electrode, the first source electrode, the second gate electrode, the second drain electrode and the second source electrode;
   removing the first stress film over the second gate electrode, the second drain electrode and the second source electrode, and leaving the first stress film over the first gate electrode, the first drain electrode and the first source electrode;
   after removing the first stress film over the second gate electrode, the second drain electrode and the second source electrode, irradiating with ultraviolet rays the first stress film remaining over the first gate electrode, the first drain electrode and the first source electrode; and
   after the irradiation, forming a second stress film over the second gate electrode, the second drain electrode and the second source electrode.

2. The method according to claim 1, wherein:
   the forming of the second stress film comprising:
   forming, after the irradiation, the second stress film over the first stress film, the second gate electrode, the second drain electrode and the second source electrode; and
   removing the second stress film over the first gate electrode, the first drain electrode and the first source electrode.

3. The method according to claim 2, wherein:
   the first transistor is an n-channel field effect transistor;
   the first stress film is a film having a tensile stress;
   the second transistor is a p-channel field effect transistor; and
   the second stress film is a film having a compressive stress.

4. The method according to claim 1, wherein:
   the first stress film irradiated with ultraviolet rays is increased in the tensile stress.

* * * * *